United States Patent [19]
Shirai

[11] Patent Number: 5,202,573
[45] Date of Patent: Apr. 13, 1993

[54] DUAL ANODE MOS SCR WITH ANTI CROSSTALK COLLECTING REGION

[75] Inventor: Koji Shirai, Kawasaki, Japan
[73] Assignee: Kabushiki Kaisha Toshiba, Kanagawa, Japan
[21] Appl. No.: 689,743
[22] PCT Filed: Oct. 5, 1990
[86] PCT No.: PCT/JP90/01295
§ 371 Date: May 21, 1991
§ 102(e) Date: May 21, 1991
[87] PCT Pub. No.: WO91/05372
PCT Pub. Date: Apr. 18, 1991

[30] Foreign Application Priority Data

Oct. 6, 1989 [JP] Japan .................. 1-261347

[51] Int. Cl.[5] .................. H01L 29/74; H01L 29/78
[52] U.S. Cl. .................. 257/140; 257/141; 257/144; 257/373
[58] Field of Search .................. 357/23.4, 38, 86

[56] References Cited

U.S. PATENT DOCUMENTS 4,403,395  9/1983  Curran .................. 357/23.4
4,628,341 12/1986  Thomas .................. 357/23.4
4,755,697  7/1988  Kinzer .................. 357/23.4

FOREIGN PATENT DOCUMENTS 51-25084  3/1976  Japan .
62-76557  4/1987  Japan .
1-145867  6/1989  Japan .

OTHER PUBLICATIONS

Robinson et al., Lateral Insulated Gate Transistors with Improved Latching Characteristics, IEEE Electron Device Letters, vol. EDL-7, No. 2, Feb. 1986.

Primary Examiner—William D. Larkins
Attorney, Agent, or Firm—Finnegan, Henderson, Farabow, Garrett & Dunner

[57] ABSTRACT

A semiconductor layer made of an epitaxial growing layer (16) is formed on the surface of a p$^-$-type silicon semiconductor substrate (11), first impurity regions are formed by p$^+$-type buried regions (171, 172) and a p-type impurity regions (221, 222) throughout the semiconductor layer from its surface to the semiconductor substrate so as to divide said semiconductor layer into side element regions (161, 162) and a central island region (163). An anode layer obtained by alternately arranging n$^+$-type impurity regions (251 to 253) and p$^+$-type impurity regions (231, 232) is formed in surface regions of the pair of impurity regions, and cathode regions made of p-type impurity regions (231, 232) are formed in the element regions of the semiconductor layer. Gate electrodes are formed to be opposite to each other through a gate insulating film in p-n junction portions constituted by the n$^+$-type impurity regions (251, 252) the p-type impurity regions (221, 222), and an n$^-$-type element region which are exposed on the surface of the substrate, thereby constituting a pair of MOS thyristors made of a p-n-p-n junction arranged in a lateral direction.

9 Claims, 6 Drawing Sheets

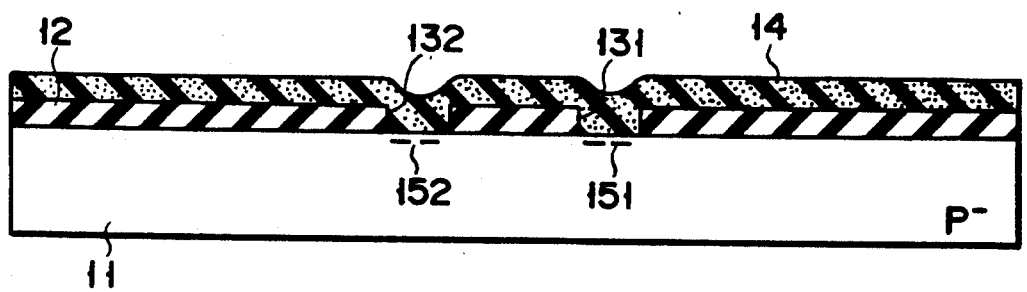
F I G. 1
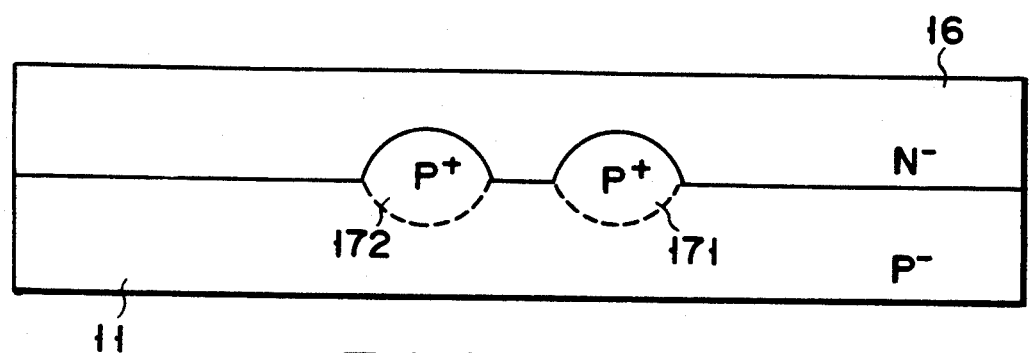
F I G. 2
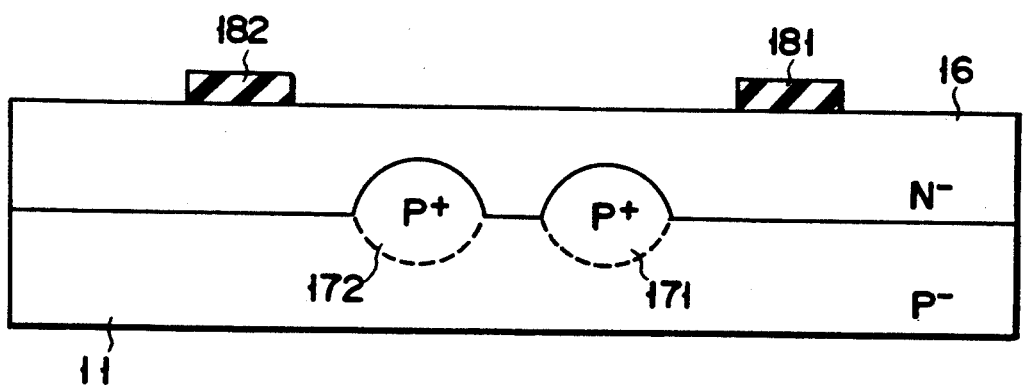
F I G. 3

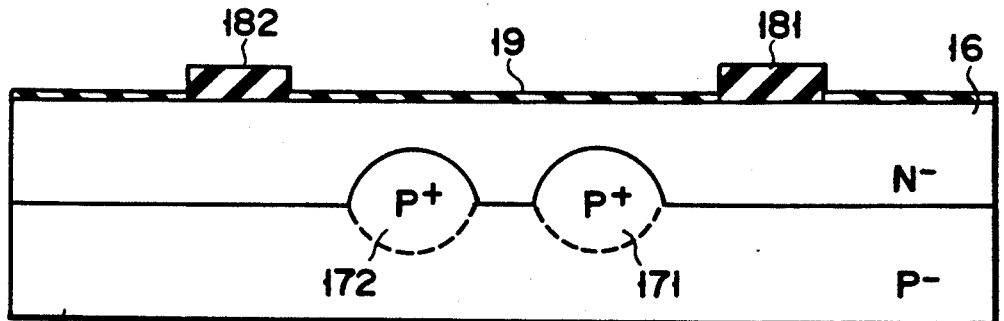
F I G. 4
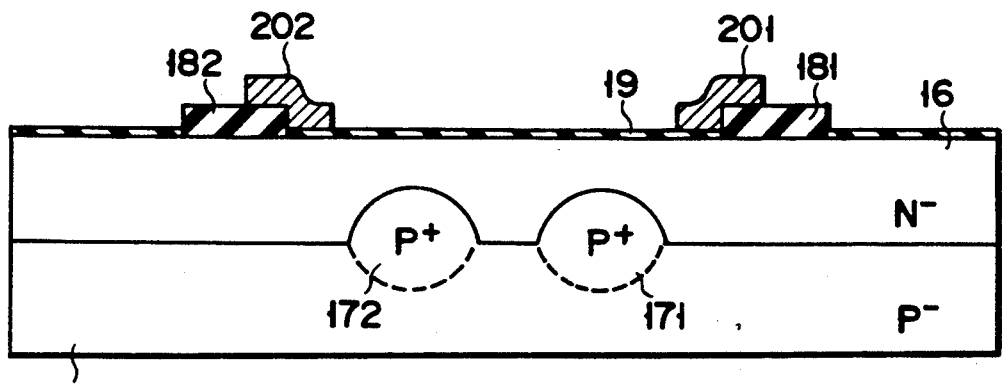
F I G. 5
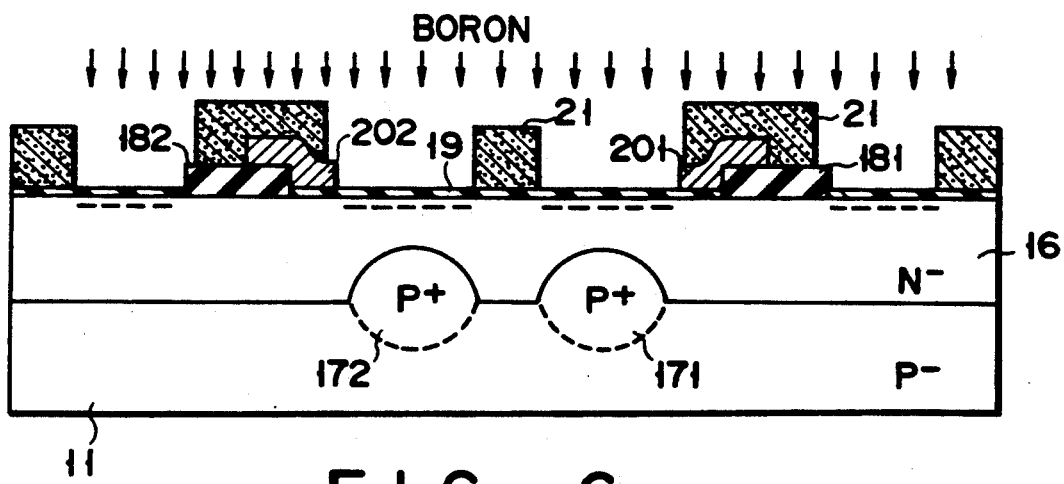
F I G. 6

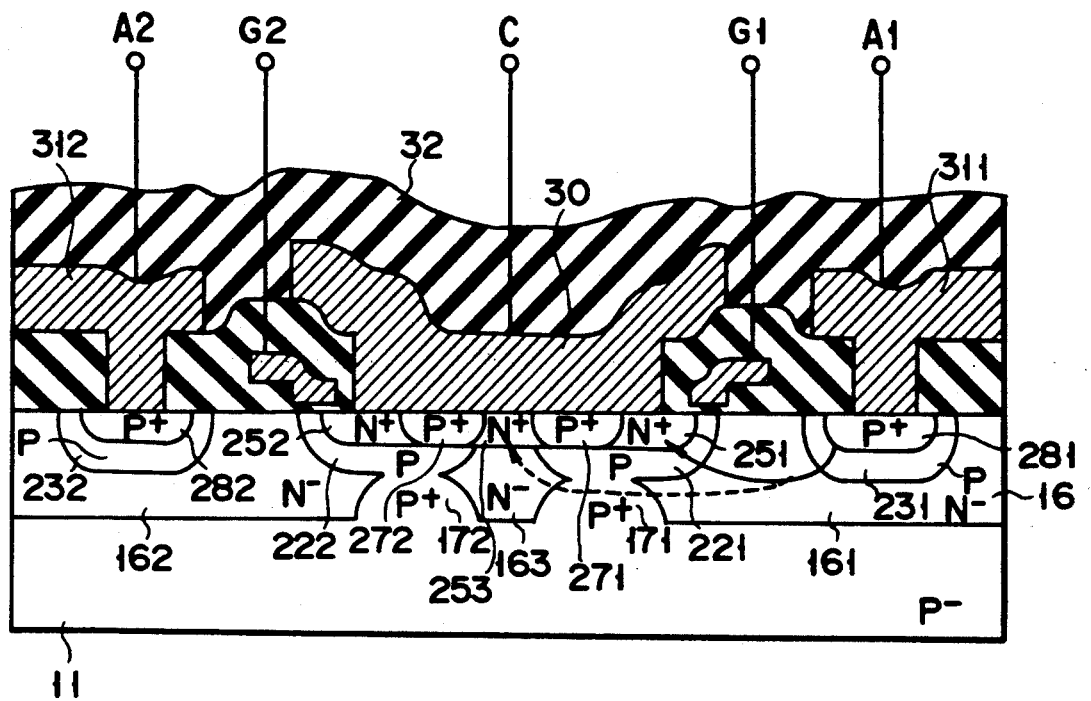
F I G. 13
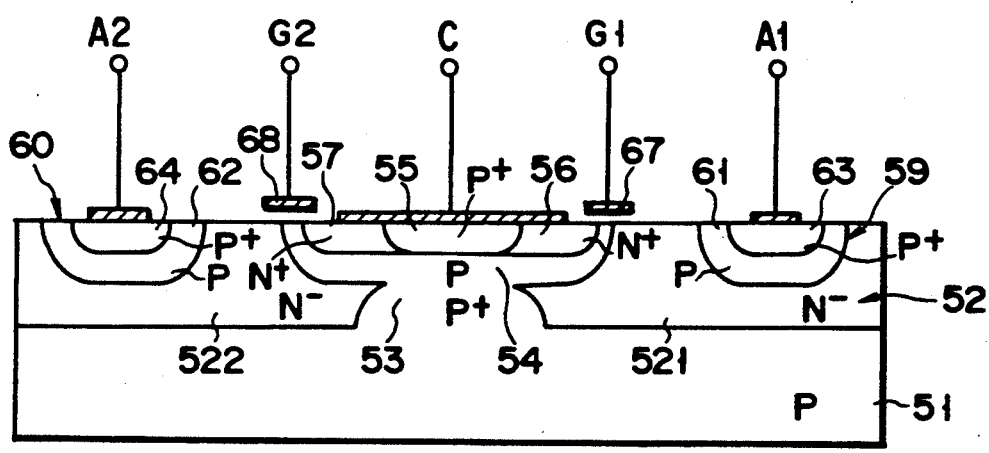
F I G. 15

DUAL ANODE MOS SCR WITH ANTI CROSSTALK COLLECTING REGION

TECHNICAL FIELD

The present invention relates to a semiconductor integrated circuit device and, more particularly, to an integrated circuit device in which a plurality of thyristors having MOS gates are formed on one semiconductor substrate.

BACKGROUND ART

A conventional semiconductor circuit device in which a plurality of MOS thyristors are formed on a semiconductor substrate is arranged as shown in FIG. 15, and the circuit device has a p-type silicon substrate 51 containing boron (B) having a concentration of about $10^{14}/cm^3$. After a silicon oxide layer is coated on the surface of the silicon substrate 51 by a conventional thermal oxidation process, openings are formed in the oxide silicon layer by a photoetching process using a mask, and boron is doped in the silicon substrate 51 through the openings. Thereafter, the oxide silicon layer is removed, and an $n^-$-type epitaxial growing layer 52 is formed. With this epitaxial growing process, the boron doped in the substrate 51 is diffused, and a $p^+$-type buried layer 53 is formed. A p-type impurity region 54 connected to the $p^+$-type buried layer 53 is formed in the surface region of the layer 52, an the $n^-$-type exitaxial region of the layer 52, and the $n^-$-type epitaxial growing layer 52 is divided into two regions 521 and 522 by the $p^+$-type buried layer 53 and the p-type impurity layer 54 which are connected to each other.

In the surface region of the p-type impurity layer 54, a high-concentration $p^+$-type impurity region 55 is formed, and $n^+$-type regions 56 and 57 are formed on both the sides of the $p^+$-type region 55. A cathode C is formed to be electrically connected to the $n^+$-, $p^+$-, and $n^+$-type impurity regions 56, 55, and 57 which are continuously connected.

Anode regions 59 and 60 are formed in the $n^{31}$-type epitaxial layer 52 so as to be divided by the buried layer 53 and the impurity layer 54. Anodes A1 and A2 constituted by the p-type impurity regions 61 and 62 and the high-concentration $p^+$-type impurity regions 63 and 64 are formed in the anode regions 59 and 60, respectively.

P-n junction portions constituted by the $n^-$-type epitaxial layer 52, the p-type impurity region 54, and the $n^+$-type impurity regions 56 and 57 are exposed on the surface of the $n^-$-type epitaxial layer 52. Gates G1 and G2 are formed by polysilicon 67 and polysilicon 68 through gate insulating films in the p-n junction portions, respectively.

That is, the $n^+$-type impurity regions 56 and 57 in the cathode region are connected to the $n^+$-type impurity regions 61 and 62 in the anode regions through the p-type impurity region 54 and the $n^-$-type epitaxial layer 52, respectively. Thus, p-n-p-n junctions are arranged in a lateral direction, thereby constituting an IGBT.

In an integrated circuit device with the above arrangement, a sufficient voltage is applied to the gate G1 to turn it on, and the gate G2 has the same potential as that of the anode A2 and is then turned off. In this case, holes injected from the anode A1 serving as a drain reach the $n^-$-type epitaxial region 522 adjacent to the region 521 from the $n^-$-type epitaxial region 521. At this time, since the $n^-$-type epitaxial region 522 in an OFF state has a high potential, the holes flow to the region 522.

The present invention has been made in consideration of the above problem, and has as its object to a semiconductor integrated circuit device in which, when a plurality of MOS thyristors are formed near the same surface of a semiconductor substrate, the thyristor elements are independently controlled without any influence on each other.

SUMMARY OF THE INVENTION

In an integrated circuit device according to the present invention, a semiconductor layer of a second conductivity type is stacked on a semiconductor substrate of a first conductivity type, a pair of first impurity regions of the first conductivity type are formed throughout the semiconductor layer from its surface to the semiconductor substrate, and the semiconductor layer is divided into an island region between the pair of first impurity regions and first and second element regions located outside the pair of first impurity regions. Anode regions made of second high-concentration impurity regions of the first conductivity type are formed in the first and second element regions, respectively, and a cathode region including high-concentration impurity regions of the first and second conductivity types which are electrically connected to each other in the first impurity regions is formed in the first impurity regions. A p-n-p-n junction is formed between the cathode region and the anode regions, and gate electrodes are formed through an insulating film on the p-n junction portions exposed on the surface of the semiconductor layer.

In an integrated circuit with the above arrangement, when a voltage is applied to one gate electrode between the anode regions sandwiching the cathode region so as to turn on the gate electrode, and when the other gate electrode is turned off, electrons flow in a direction of the ON-state anode region, and holes flow to the cathode region. However, since a current flowing as described above is trapped by the island region formed between the pair of first impurity regions, the current is not supplied to the OFF-state region. Therefore, mutual interference of the anode regions formed to sandwich the cathode region is certainly prevented, an erroneous operation can be suppressed, and a maximum current can be largely increased.

BRIEF DESCRIPTION OF DRAWINGS

FIGS. 1 to 13 are views for explaining an integrated circuit device made of a semiconductor in an order of manufacturing steps according to one embodiment of the present invention, FIG. 15 is a sectional view of an arrangement showing a conventional integrated circuit.

DETAILED DESCRIPTION OF THE INVENTION

Figure 7:
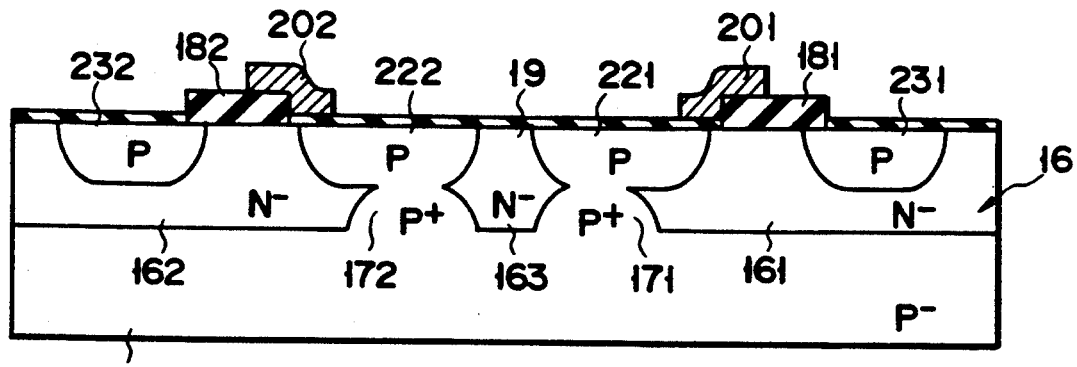

An embodiment of the present invention will be described below in accordance with manufacturing steps. An integrated circuit device described in this embodiment is constituted by an n-channel MOS thyristor. As shown in FIG. 1, p-type silicon semiconductor substrate 11 containing boron (B) of about $10^{14}/cm^3$ is prepared, and the semiconductor substrate 11 is held in a steam atmosphere at a temperature of 1,000° C. A silicon dioxide layer 12 having a thickness of 1 $\mu$m is formed on the surface of the substrate 11. Conventional photoetching is performed to the silicon dioxide layer 12 to form first and second openings 131 and 132.

A CVD oxide silicon layer 14 in which boron is doped is formed on the silicon dioxide layer 12 having the openings 131 and 132 by a chemical vapor deposition method When the oxide silicon layer 14 is formed, the resultant structure is held at a temperature of 1,100° C. for 1 hour, boron contained in the silicon layer 14 is doped in the p-type silicon semiconductor substrate 11 through the openings 131 and 132, thereby forming buried region bases 151 and 152.

The oxide silicon layers 12 and 14 formed on the semiconductor substrate 11 are removed by an HF solution, and then a semiconductor layer made of an $n^-$-type epitaxial growing layer 16 containing phosphorus (P) of $10^{15}/cm^3$ and having a thickness of 5 $\mu$m is grown on the silicon semiconductor substrate 11 by an epitaxial method (FIG. 2). In this epitaxial growing process, the boron in the buried region bases 151 and 15 is diffused in the epitaxial growing layer 16, thereby forming first and second $p^+$-type buried regions 171 and 172.

As described above, an epitaxial growing layer 16 formed on the substrate 11 is held in a steam atmosphere at a temperature of 1,000° C., a silicon dioxide layer having a thickness of 1 $\mu$m is formed on the surface of the epitaxial growing layer 16. A mask having openings at portions corresponding to regions to which the $p^+$-type buried regions 171 and 172 are formed is formed on the silicon dioxide layer, and as shown in FIG. 3, first and second oxide silicon layers 181 and 182 are formed. As described above, when the oxide silicon layers 181 and 182 are formed, as shown in FIG. 4, dry oxidation is performed on the surface of the $n^-$-type epitaxial growing layer 16 at a temperature of 1,000° C. to form a gate oxide film 19 having a thickness of about 1,000 Å.

A polysilicon layer having a thickness of about 5,000 Å is formed on the oxide silicon layers 181 and 182 and the gate oxide film 19 by a low-pressure CVD method. This polysilicon layer is patterned by a photoetching process using isotropic or anisotropic etching. As shown in FIG. 5, a first electrode 201 is formed to bridge the oxide silicon layer 181 and the gate oxide film 19, and a second electrode 202 is formed to bridge the oxide silicon layer 182 and the gate oxide film 19.

After the gate electrode is formed, a step of forming an impurity region is started. As shown in FIG. 6, the resultant structure is coated with a photoresist pattern 21, boron serving as a p-type impurity is doped in the $n^-$-type epitaxial growing layer 16 at portions corresponding to the $p^+$-type buried regions 171 and 172 and outside the oxide silicon layers 181 and 182 by an ion implantation method using the photoresist pattern as a mask. Thereafter, the resultant structure is annealed at a temperature of 1,200° C. for 1 hour to diffuse the doped impurity, and, as shown in FIG. 7, p-type impurity regions 221 and 222 respectively connected to the $p^+$-type impurity regions 171 and 172 are formed. The impurity regions 221 and 222 constitute a pair of first impurity region with the $p^+$-type buried regions 171 and 172. Second p-type impurity regions 231 and 232 serving as anode regions are formed outside the oxide silicon layers 181 and 182, respectively.

With this step, the pair of first p-type impurity regions consisting of the $p+$-type impurity regions 171 and 172 and the p-type impurity regions 221 and 222 are electrically connected to the p-type silicon semiconductor substrate 11 to divide the $n^-$-type epitaxial growing layer 16 into three regions. That is, the $n^-$-type epitaxial growing layer 16 is divided into the first and second element regions 161 and 162 to which the p-type impurity regions 231 and 232 are located and into an island region 163 sandwiched by the p-type impurity regions 221 and 223.

Figure 8:
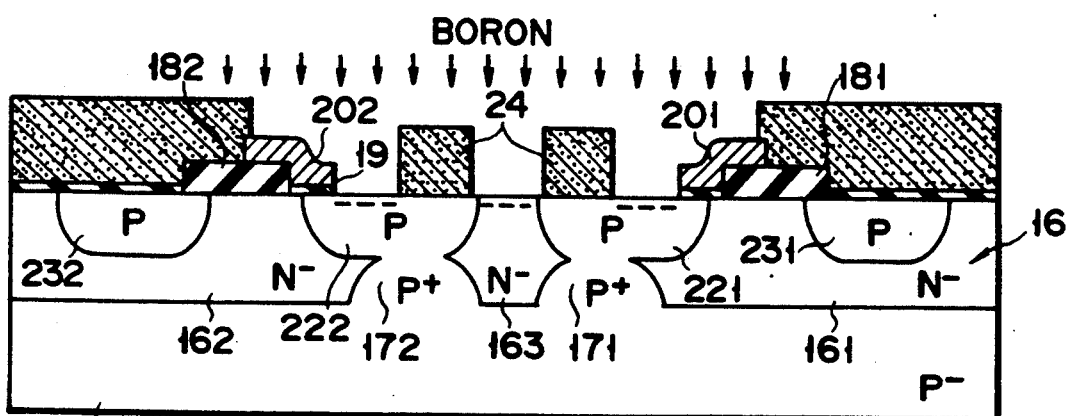
Figure 9:
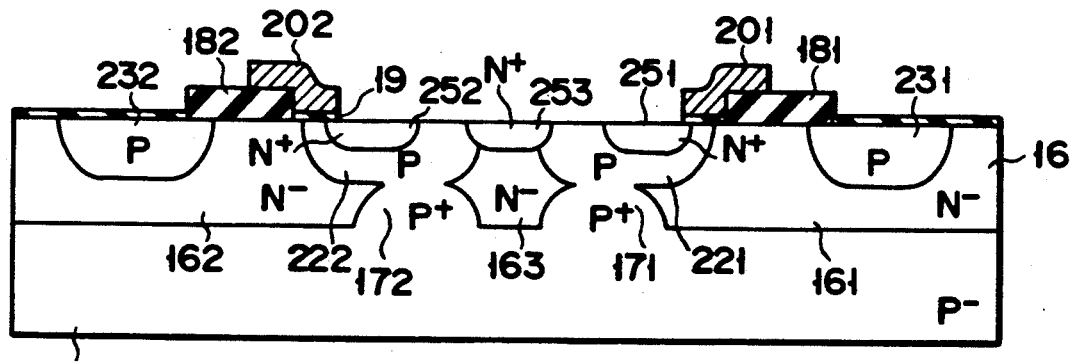

As shown in FIG. 8, the resultant structure is covered with a resist pattern 24 in which portions opposite to the island regions 163 of the p-type impurity regions 221 and 222 and a portion corresponding to the $n^-$-type island region 163 are open. The gate oxide film 19 exposed from the openings formed i the resist pattern is removed by a ammonium fluoride solution, and arsenic (As) serving as an n-type impurity is doped from the openings by an ion implantation method. Thereafter, the resultant structure is annealed in an oxygen atmosphere for ten minutes to diffuse the doped arsenic, and as shown in FIG. 9, $n^+$-type impurity regions 251, 252, and 253 each having a high surface concentration of about $10^{21}/cm^3$ are formed. The resist pattern 24 is removed.

Figure 10:
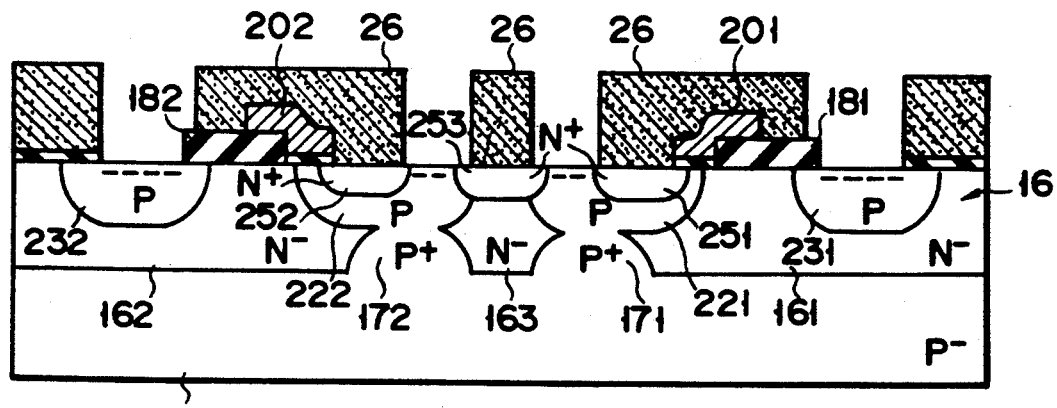
Figure 11:
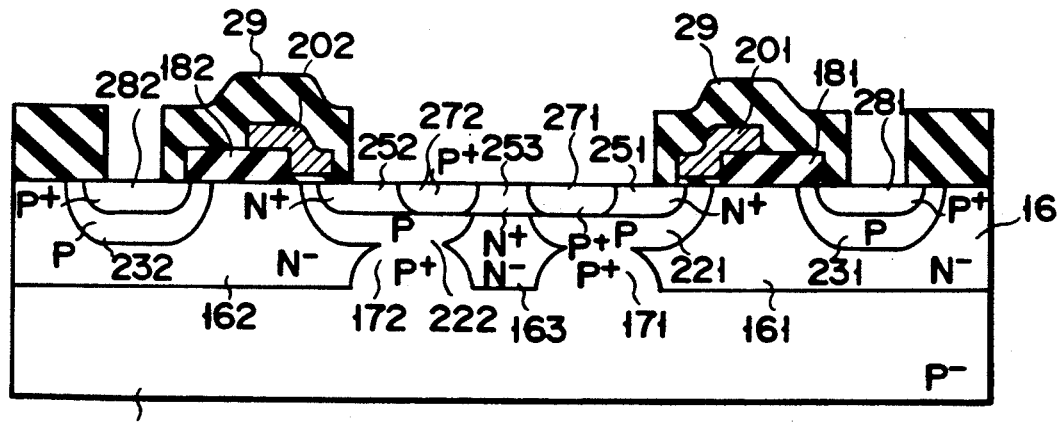

As shown FIG. 10, a resist pattern 26 is formed such that openings are formed in portions except for the $n^+$-type impurity regions 251 to 253 of the p-type impurity region and at the center portions of the p-type impurity regions 231 and 232 located outside the oxide silicon layers 181 and 182, and boron is doped from the openings of the resist pattern 26. Thereafter, as shown in FIG. 11, the doped boron is diffused to form impurity regions 271 and 272 each having a high surface concentration of about $10^{20}/cm^3$ at positions between the $n^+$-type impurity regions 251 to 253 in the p-type impurity regions 221 and 222. In the p-type impurity regions 231 and 232, $p^+$-type impurity regions 281 and 282 are formed. Thereafter, a silicon dioxide layer 29 is formed to have a thickness of 1 $\mu$m, and contact holes are formed in the silicon dioxide layer 29 at portions corresponding to the $n^+$-type impurity regions 251 to 253, the surfaces regions of the $p^+$-type impurity regions 271 and 272, and the $p^+$-type impurity regions 281 and 282 which are sequentially formed.

Figure 12:
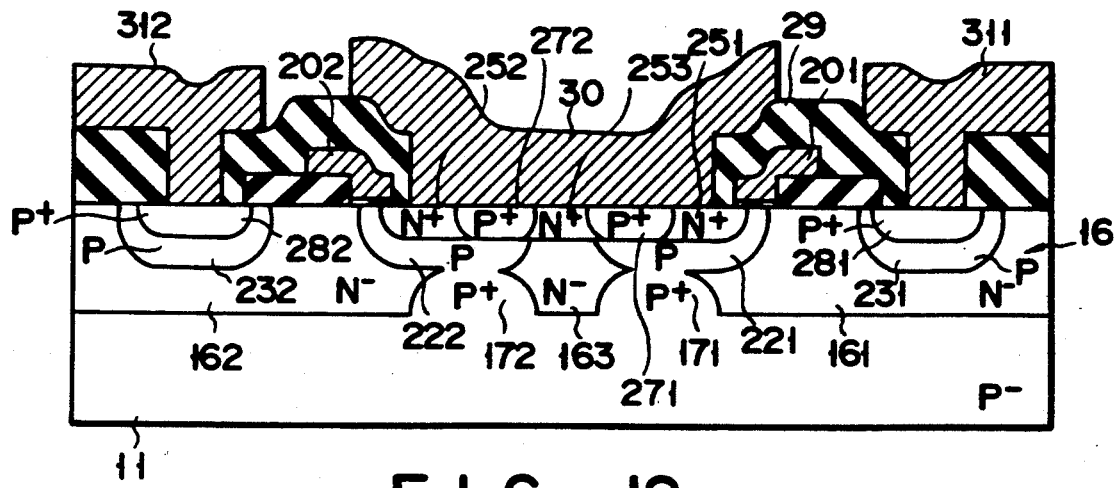

On the silicon dioxide layer 29 in which the contact holes are formed as described above, a wiring layer made of aluminum or an aluminum alloy (Al-Si or Al-Si-Cu) is formed by vacuum deposition or sputtering, as shown in FIG. 12. This wiring layer is patterned by a photoetching process to form an anode electrode 30 commonly connected to the $n^+$-type impurity regions 251 to 253 and the $p^+$-type impurity regions 271 and 272 and cathode electrodes 311 and 312 respectively connected to the $p^+$-type impurity regions 281 and 282.

FIG. 13 shows the sectional structure of a completed integrated circuit device. In FIG. 13, after the electrodes 30, 311, and 312 are formed, the entire surface of the resultant structure is covered by a PSG layer 32. A cathode terminal C extends from the cathode electrode 30, and anode terminals A1 and A2 extend from the anode electrodes 311 and 312, respectively. In addition, gate terminals G1 and G2 extend from the gate electrodes 201 and 202, respectively.

In an integrated circuit device having the above structure, the $n^+$-type impurity region 253 connected to the cathode electrode 30 is electrically connected to the n⁻-type island region 163, and the p⁺-type buried regions 251 and 252 connected to the cathode electrode 30 are connected to the p-type impurity regions 221 and 222 and electrically connected to the p⁻-type silicon semiconductor substrate 11 through the p⁺-type buried regions 171 and 172 on both the sides of the island region 163 formed by an epitaxial growing layer.

That is, MOS thyristors are formed on both the sides of the island region 163 formed as a center by the n⁻-type epitaxial growing layer connected to the anode region. Upon application of a voltage to the gate G1, for example, holes flow from the p-type impurity region of the anode A1 into the n⁺-type impurity region 251 of the cathode region through the n⁻-type epitaxial growing layer 161 and the p-type impurity system 221, as indicated by an arrow in FIG. 13. In this case, even when the other MOS thyristor is set in an OFF state, i.e., when the gate G2 and the cathode C2 are set at the same potential, the current is trapped by the island region 163 located at the center, as is indicated by a broken arrow in FIG. 13. Therefore, there is no influence on the MOS thyristor set in an OFF state, and an erroneous operation of the MOS thyristor is reliably prevented.

In the above-described embodiment, in order to form the island region 163 at the center, the p⁺-type buried regions 171 and 172 and the p-type impurity regions 221 and 222 are sequentially formed. In this case, the island region 163 may be formed by a deep layer.

Figure 14A:
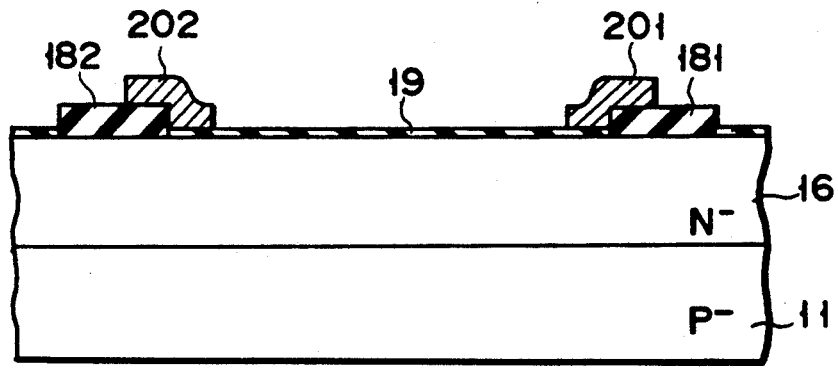
FIGS. 14A to 14C are views for explaining an integrated circuit device in an order of manufacturing steps according to the other embodiment of the present invention.
Figure 14B:
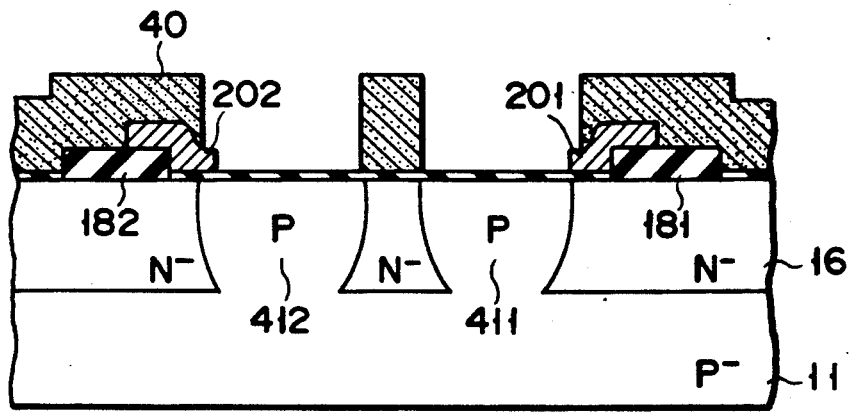
Figure 14C:
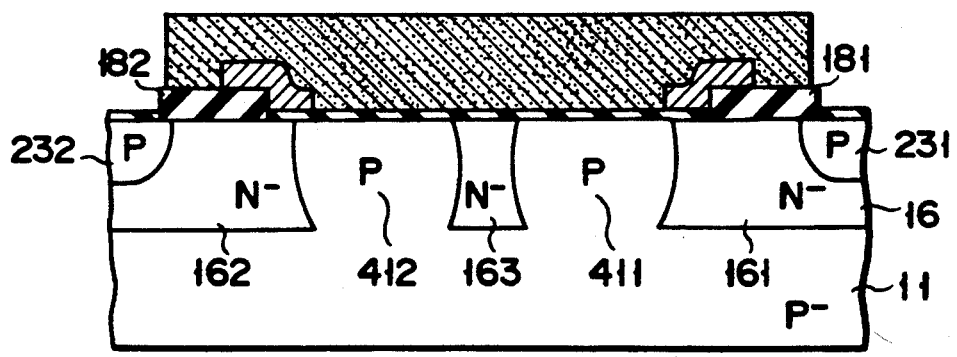

In FIGS. 14A to 14C, an embodiment of a structure using a deep layer is described. As shown in FIG. 14A, as in the previous embodiment, an n⁻-type epitaxial growing layer 16 is formed on the surface of the p⁻-type silicon semiconductor substrate 11. Silicon oxide layers 181 and 182 and a gate oxide film 19 are formed on the n⁻-type epitaxial growing layer 16, thereby forming gate electrodes 201 and 202 made of polysilicon. As shown in FIG. 14B, boron is doped in the n⁻-type epitaxial growing layer 16 by an ion implantation method using a resist pattern 40 as a mask having openings near the gate electrodes 201 and 202, and the doped boron is diffused to form p-type impurity regions 411 and 412 each having a surface concentration of $10^{17}/cm^3$. The p-type impurity regions 411 and 412 serve as channel layers, thereby forming an n⁻-type island region 163. As shown in FIG. 14C, a resist pattern 42 is formed again, and boron is doped using the resist pattern 42 as a mask and is diffused, thereby forming p-type impurity regions 231 and 232 serving as anode regions each having a surface concentration of $10^{17}/cm^3$. In this process, the same structure as described in FIG. 7 is obtained. Subsequently, a semiconductor integrated circuit is arranged in the same process as described in FIGS. 8 to 13.

In this embodiment, the n⁻-type epitaxial layer 16 is formed on the p⁻-type silicon semiconductor substrate 11, and the first p-type impurity layer is formed throughout the epitaxial growing layer 16, thereby dividing the n⁻-type epitaxial growing layer 16 into the element regions 161 and 162 and the island region 163. However, in the integrated circuit device, a p-type semiconductor layer may be formed on the n-type semiconductor substrate to constitute a first p-type impurity layer. In this case, the conductivity types of high-concentration impurity regions in the cathode region are opposite to each other. The conductivity type of the anode region is an n conductivity type which is opposite to that in the embodiment of the present invention.

I claim:

1. An integrated circuit device comprising:
   a semiconductor substrate of a first conductivity type;
   a semiconductor layer of a second conductivity type on said semiconductor substrate of the first conductivity type;
   a pair of first impurity regions in said semiconductor layer extending from a surface of said semiconductor layer to said semiconductor substrate, which pair of first impurity regions divide said semiconductor layer into first and second side element regions and a central island region;
   a first main layer comprising a first high-concentration region of the second conductivity type in a surface region of said island region of said semiconductor layer, second high-concentration regions of the first conductivity type in surface regions of said first impurity regions in contact with both sides of said first high-concentration region of the second conductivity type, third high-concentration regions of the second conductivity type in the surface regions of said first impurity regions in contact with said second high-concentration regions;
   a first main electrode on a surface of said first main layer;
   second impurity regions of the first conductivity type on surface regions of said first and second element regions of said semiconductor layer of the second conductivity type;
   second main electrodes in electric contact with said second impurity regions in said first and second element regions; and
   gate electrodes on opposite sides of said island region on a gate insulating film and above p-n junction portions exposed on surfaces of outer peripheral portions of said first impurity regions, surfaces of said first and second element regions, and surfaces of said second impurity regions.

2. An integrated circuit device according to claim 1, wherein the first conductivity type is constituted by containing a p-type impurity, and the second conductivity type is constituted by containing an n-type impurity.

3. An integrated circuit device according to claim 1, wherein said semiconductor substrate is constituted by a silicon semiconductor substrate containing a p-type impurity, and said semiconductor layer is constituted by an n⁻-type epitaxial growing layer formed on a surface of said silicon semiconductor substrate.

4. An integrated circuit device according to claim 1, wherein said first impurity region is constituted by a buried region formed in said second semiconductor layer of the second conductivity type to be in contact with said semiconductor substrate and an impurity region of the second conductivity type formed from the surface of said semiconductor substrate to said buried region.

5. An integrated circuit device according to claim 4, wherein said semiconductor substrate of the first conductivity type is constituted by a p-type silicon substrate, said semiconductor layer of the second conductivity type is constituted by an n⁻-type epitaxial growing layer, and said p⁺-type buried region is formed when said n⁻-type epitaxial growing layer is formed.

6. An integrated circuit device according to claim 1, wherein said pair of first impurity regions of the first conductivity type are formed to deeply diffuse an impurity of the first conductivity type from the surface of said semiconductor layer to said semiconductor substrate.

7. An integrated circuit device according to claim 6, wherein said semiconductor substrate is constituted to have a p conductivity type, said semiconductor layer is constituted to have an n conductivity type, and said first impurity region is constituted to have the p conductivity type.

8. An integrated circuit device according to claim 1, wherein a region comprising a p-type region, an n-type region, a p-type region, and an n-type region, arranged sequentially, is along the surface of the semiconductor layer between said first main region and said second impurity regions located on both sides of said first main region.

9. An integrated circuit device comprising:
a silicon semiconductor substrate containing a p-type impurity;
a semiconductor layer formed on a surface of said silicon semiconductor substrate by an epitaxial growing layer;
a pair of first p-type impurity regions which divide said semiconductor layer into first and second side element regions corresponding to anode regions and a central island region and which extend from the surface of said semiconductor layer to said semiconductor substrate;
a cathode region comprising an n-type high-concentration impurity region exposed on a surface of said island region of said semiconductor layer, p-type high concentration impurity regions in contact with both sides of said impurity region and exposed on a surface of said first impurity region, and an n-type high-concentration impurity region in contact with portions outside said p-type high-concentration impurity regions and exposed on the surface of said first impurity region in said first impurity region;
a cathode electrode connected to said high-concentration impurity regions of the first and second conductivity types comprising said cathode region;
a pair of second impurity regions apart from said pair of first impurity regions and in surface regions of said first and second element regions;
a pair of anode electrodes connected to said pair of second impurity regions, and
gate electrodes on opposite sides of said island region on a gate insulating film and above p-n junction portions exposed on surfaces of outermost n-type high concentration impurity regions comprising said cathode region, surfaces of said first p-type impurity regions, and surfaces of said first and second side element regions;
wherein said cathode region is electrically connected to said semiconductor substrate through said pair of first impurity regions.

* * * * *